United States Patent
Hoshino

(10) Patent No.: US 10,270,388 B2
(45) Date of Patent: Apr. 23, 2019

(54) VOLTAGE-CONTROLLED OSCILLATOR AND PHASE LOCKED LOOP CIRCUIT WITH SUCH VOLTAGE-CONTROLLED OSCILLATOR

(71) Applicant: Kabushiki Kaisha Toshiba, Minato-ku, Tokyo (JP)

(72) Inventor: Hiroaki Hoshino, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/700,599

(22) Filed: Sep. 11, 2017

(65) Prior Publication Data
US 2018/0269830 A1 Sep. 20, 2018

(30) Foreign Application Priority Data
Mar. 15, 2017 (JP) .................... 2017-049481

(51) Int. Cl.
| | |
|---|---|
| H03L 7/00 | (2006.01) |
| H03B 5/08 | (2006.01) |
| H03B 1/04 | (2006.01) |
| H03L 7/099 | (2006.01) |
| H03L 7/089 | (2006.01) |

(Continued)

(52) U.S. Cl.
CPC .................. *H03B 1/04* (2013.01); *H03B 5/04* (2013.01); *H03B 5/1212* (2013.01); *H03L 7/0891* (2013.01); *H03L 7/099* (2013.01); *H03B 5/1228* (2013.01); *H03B 2200/004* (2013.01); *H03B 2200/009* (2013.01); *H03L 7/093* (2013.01); *H03L 7/18* (2013.01); *H03L 2207/05* (2013.01)

(58) Field of Classification Search
CPC .......... H03B 1/04; H03B 5/04; H03B 5/1212; H03B 2200/004; H03B 5/1228; H03B 2200/009; H03L 7/099; H03L 7/0891; H03L 2207/05; H03L 7/093; H03L 7/18
See application file for complete search history.

(56) References Cited

U.S. PATENT DOCUMENTS

| | | | |
|---|---|---|---|
| 7,005,936 B2* | 2/2006 | Tanzawa .................. | H03C 3/08 331/17 |
| 7,164,325 B2 | 1/2007 | Aparin et al. | |

(Continued)

FOREIGN PATENT DOCUMENTS

| | | |
|---|---|---|
| JP | 2011-518535 A | 6/2011 |
| JP | 5528944 B2 | 6/2014 |

(Continued)

*Primary Examiner* — Kenneth B Wells
(74) *Attorney, Agent, or Firm* — White & Case LLP

(57) ABSTRACT

According to an embodiment, a voltage-controlled oscillator has a variable capacitive element with a capacitance that is changed by a voltage to be applied thereto. One electrode of the variable capacitive element is connected to a control input terminal where a control voltage that controls an oscillation frequency is applied thereto. It has a compensation voltage generation circuit that generates a voltage that changes with a temperature thereof. It has a resistive element with one end that is directly connected to another electrode of the variable capacitive element and another end that is supplied with an output voltage of the compensation voltage generation circuit.

12 Claims, 10 Drawing Sheets

(51) Int. Cl.
*H03B 5/04* (2006.01)
*H03B 5/12* (2006.01)
H03L 7/093 (2006.01)
H03L 7/18 (2006.01)

(56) References Cited

U.S. PATENT DOCUMENTS

| | | | | |
|---|---|---|---|---|
| 7,183,870 | B2* | 2/2007 | Takagi | H03B 5/1228 331/117 FE |
| 7,446,617 | B2* | 11/2008 | Jang | H03B 19/14 331/117 FE |
| 8,022,780 | B2 | 9/2011 | Taghivand et al. | |
| 8,072,282 | B2* | 12/2011 | Sun | H03L 1/023 331/176 |
| 8,253,506 | B2* | 8/2012 | Liu | H03L 1/023 331/117 R |
| 8,466,750 | B2* | 6/2013 | Chiu | H03B 5/1228 331/117 FE |
| 8,493,114 | B2* | 7/2013 | Cho | H03L 1/022 327/147 |
| 8,717,113 | B2 | 5/2014 | Iizuka et al. | |
| 9,344,034 | B2 | 5/2016 | Iizuka et al. | |
| 9,680,479 | B1* | 6/2017 | Chang | H03B 5/04 |
| 2007/0146082 | A1* | 6/2007 | Ohara | H03L 7/099 331/16 |
| 2008/0272851 | A1* | 11/2008 | Lin | H03B 5/1228 331/115 |
| 2009/0033428 | A1 | 2/2009 | Karri | |
| 2009/0310712 | A1* | 12/2009 | Nakatani | H03L 7/099 375/316 |
| 2012/0223771 | A1* | 9/2012 | Zhang | H03L 1/02 327/586 |
| 2012/0249249 | A1* | 10/2012 | Shen | H03L 1/02 331/16 |

FOREIGN PATENT DOCUMENTS

| | | |
|---|---|---|
| JP | 5613581 B2 | 10/2014 |
| JP | 5628436 B2 | 11/2014 |
| JP | 2015-008397 A | 1/2015 |

* cited by examiner

VOLTAGE-CONTROLLED OSCILLATOR AND PHASE LOCKED LOOP CIRCUIT WITH SUCH VOLTAGE-CONTROLLED OSCILLATOR

CROSS-REFERENCE TO RELATED APPLICATIONS

This application is based upon and claims the benefit of priority from Japanese Patent Application No. 2017-049481, filed on Mar. 15, 2017; the entire contents of which are incorporated herein by reference.

FIELD

The present embodiment generally relates to a voltage-controlled oscillator and a phase locked loop circuit with such a voltage-controlled oscillator.

BACKGROUND

A technique is conventionally disclosed that adds a capacitive element for temperature compensation in order to reduce a temperature dependence where an oscillation frequency of a voltage-controlled oscillator varies with a temperature thereof. However, addition of a capacitive element for temperature compensation results in adding a normally unnecessary capacitance so as to degrade a noise characteristic of a voltage-controlled oscillator, and increases a surface area of a semiconductor integrated circuit device that composes such a voltage-controlled oscillator so as to cause a cost increase thereof. Furthermore, in a voltage-controlled oscillator, an oscillation frequency is controlled by, for example, a signal from a loop filter in a Phase Locked Loop (PLL) circuit. In a case where a circuit for temperature compensation influences a loop characteristic of a PLL, an operation of such a PLL circuit is destabilized. Therefore, it is desired that a configuration to reduce a temperature dependence of a voltage-controlled oscillator is a configuration that does not influence a circuit characteristic of a system to be incorporated therein, also does not have to add a capacitive element for temperature compensation, does not degrade a characteristic of such a voltage-controlled oscillator, and is capable of reducing a cost thereof.

DETAILED DESCRIPTION

According to one embodiment, a voltage-controlled oscillator with an oscillation frequency that is defined by values of a capacitance of a capacitive element and an inductance of an inductive element is provided, wherein the capacitive element has a variable capacitive element with a capacitance that is changed by a voltage to be applied thereto. It has a control input terminal that is connected to one electrode of the variable capacitive element where a control voltage that controls an oscillation frequency is applied thereto. It has a compensation voltage generation circuit that generates a voltage that changes with a temperature thereof. It has a resistive element with one end that is directly connected to another electrode of the variable capacitive element and another end that is supplied with a voltage at an output terminal of the compensation voltage generation circuit.

Hereinafter, a voltage-controlled oscillator according to an embodiment will be described in detail with reference to the accompanying drawings. Additionally, the present invention is not limited by such an embodiment.

Figure 1:
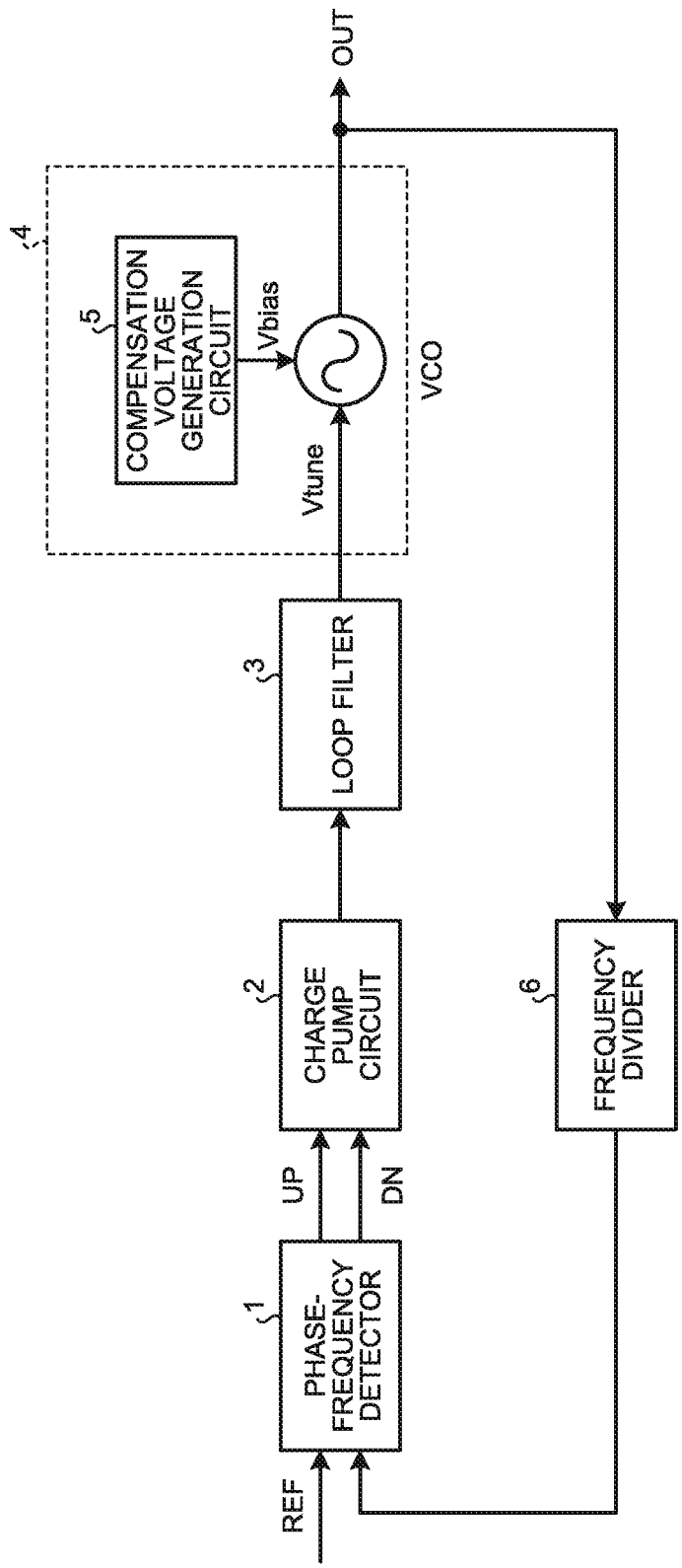
FIG. 1 is a diagram illustrating a configuration example of a PLL circuit that incorporates a voltage-controlled oscillator according to an embodiment therein.

FIG. 1 is a diagram illustrating a configuration example of a PLL circuit that incorporates a voltage-controlled oscillator according to an embodiment therein. A PLL circuit has a phase-frequency detector 1, a charge pump circuit 2, a loop filter 3, a voltage-controlled oscillator (VCO) 4, and a frequency divider 6.

The phase-frequency detector 1 is supplied with an input REF and an output signal of the frequency divider 6. The phase-frequency detector 1 executes comparison with respect to a phase difference between an input REF and an output signal of the frequency divider 6, and outputs an output signal (UP, DN) depending on a result of such comparison. An output signal UP is a signal that increases an oscillation frequency of the voltage-controlled oscillator 4, and in a case where a rise or a fall of an input REF is faster than a rise or a fall of an output signal of the frequency divider 6, is an output of Hi during only a time difference therebetween. On the other hand, an output signal DN is a signal that decreases an oscillation frequency of the voltage-controlled oscillator 4, and in a case where a rise or a fall of an output signal of the frequency divider 6 is faster than a rise or a fall of an input REF, is an output of Hi during only a time difference therebetween. An output signal (UP, DN) is, for example, a digital signal.

An output signal (UP, DN) of the phase-frequency detector 1 is supplied to the charge pump circuit 2. The charge pump circuit 2 pours an electric current into the loop filter 3 or draws an electric current from the loop filter 3 during only a period of time when an output signal (UP, DN) of the phase-frequency detector 1 is Hi.

The loop filter 3 composes, for example, a low-pass filter with a resistive element and a capacitive element. A phase noise characteristic is determined thereby, so that an operation of a PLL circuit is stabilized. A control voltage Vtune of the loop filter 3 is supplied to the voltage-controlled oscillator 4.

The voltage-controlled oscillator 4 has a compensation voltage generation circuit 5. The compensation voltage generation circuit 5 generates a compensation voltage Vbias for reducing a variation of an oscillation frequency that is caused by a temperature change. A compensation voltage Vbias is supplied to a LC resonance circuit (non-illustrated) that determines a frequency of the voltage-controlled oscillator 4. A configuration of an embodiment of the voltage-controlled oscillator 4 that includes the compensation voltage generation circuit 5 will be described later. An output OUT of the voltage-controlled oscillator 4 is output.

An output OUT of the voltage-controlled oscillator 4 is supplied to the frequency divider 6. The frequency divider 6 divides a frequency of such an output OUT by a factor of 1/N to be supplied to the phase-frequency detector 1. A PLL circuit compares a signal from the frequency divider 6 with an input REF that is supplied to the phase-frequency detector 1 and operates in such a manner that both of them coincide therewith. That is, an operation is executed in such a manner that an output OUT provided by multiplying a frequency of an input REF by a factor of N is output.

First Embodiment

Figure 2:
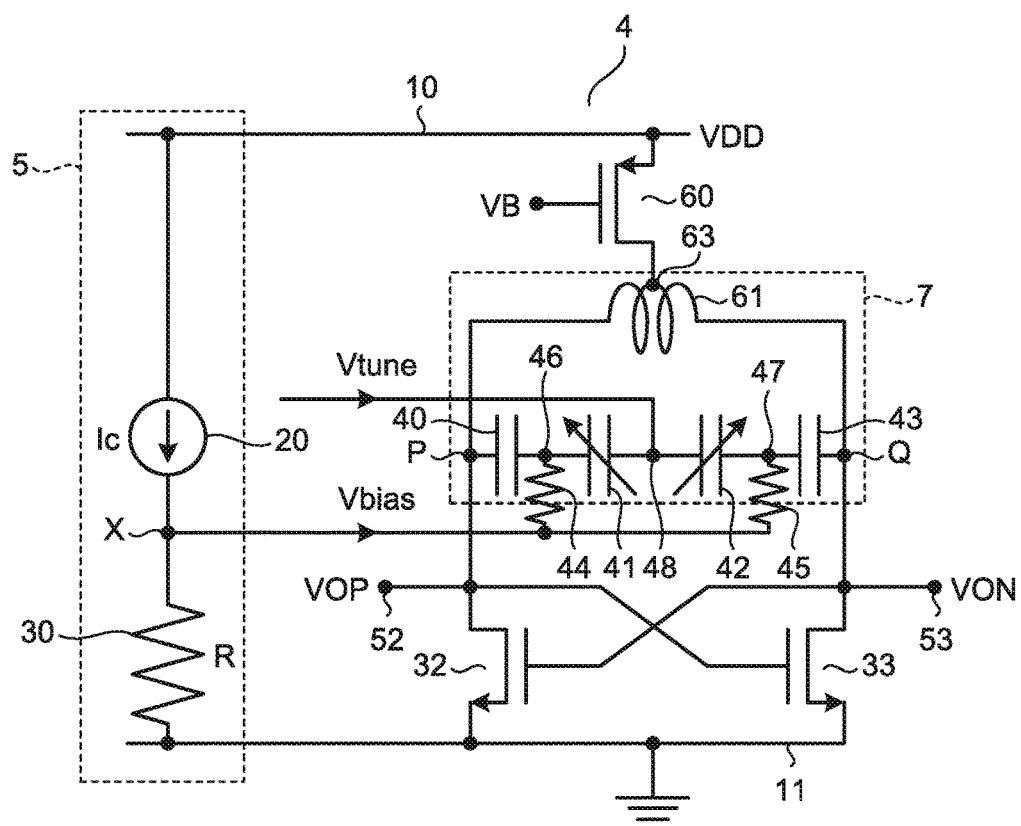
FIG. 2 is a diagram illustrating a configuration of a voltage-controlled oscillator according to a first embodiment.

FIG. 2 is a diagram illustrating a configuration of a voltage-controlled oscillator 4 according to a first embodiment. The voltage-controlled oscillator 4 according to the present embodiment has a compensation voltage generation circuit 5 that is connected between an electric power source supply line 10 where an electric power source voltage VDD is applied thereto and an electric power source supply line 11 where a ground potential is applied thereto. The compensation voltage generation circuit 5 generates a compensation voltage Vbias that changes with a temperature thereof. The compensation voltage generation circuit 5 has a series circuit of a negative temperature characteristic electric current source 20 that supplies an electric current Ic with an electric current value that decreases with a temperature rise and a resistor 30.

It is possible to compose the negative temperature characteristic electric current source 20 with a Complementary-to-Absolute-Temperature (CTAT) electric current source that supplies an electric current that has a negative slope with respect to, and decreases in proportion to, an absolute temperature thereof.

The resistor 30 is supplied with an electric current Ic of the negative temperature characteristic electric current source 20. A compensation voltage Vbias dependent on a voltage drop caused by an electric current Ic generates at an output terminal X.

The voltage-controlled oscillator 4 has a PMOS transistor 60. A source of the PMOS transistor 60 is connected to the electric power source supply line 10 and a drain thereof is connected to an inductive element 61. A gate of the PMOS transistor 60 is supplied with a bias voltage VB. A point 63 where a drain of the PMOS transistor 60 is connected thereto is a middle point of the inductive element 61 or is a point with a value of ½ of an inductance of the inductive element 61.

A series circuit of a capacitive element 40, a variable capacitive element 41, a variable capacitive element 42, and a capacitive element 43 is connected between a point P where one end of the inductive element 61 is connected thereto and a point Q where the other end is connected thereto. The inductive element 61 and a series circuit of the capacitive element 40, the variable capacitive element 41, the variable capacitive element 42, and the capacitive element 43 compose an LC resonance circuit 7.

A control input terminal 48 that is a common connection terminal for one electrode of the variable capacitive element 41 and one electrode of the variable capacitive element 42 is supplied with a control voltage Vtune. A capacitance of the variable capacitive element 41, 42 is changed depending on a value of a control voltage Vtune to control an oscillation frequency of the voltage-controlled oscillator 4. A control voltage Vtune is supplied from, for example, the loop filter 3 of a PLL circuit.

The capacitive element 40 that is connected between the variable capacitive element 41 and a point P and the capacitive element 43 that is connected to the variable capacitive element 42 and a point Q prevent direct current voltages at a point P and a point Q from influencing the variable capacitive elements 41 and 42, respectively. Thereby, it is possible to control a capacitance of the variable capacitive element 41, 42 by a voltage difference (Vtune−Vbias) between a control voltage Vtune and a compensation voltage Vbias.

A connection point 46 for the capacitive element 40 and the other electrode of the variable capacitive element 41 and a connection point 47 for the other electrode of the variable capacitive element 42 and the capacitive element 43 are directly connected to ends of resistive elements 44, 45 that correspond thereto, respectively, and the other end of each of the resistive elements 44, 45 is directly connected to an output terminal X of the compensation voltage generation circuit 5, and receives supply of a compensation voltage Vbias. Direct connection as described herein includes a general connection configuration provided by a wire, a via, or the like, without a circuit element such as an active element that changes a value of a resistance of the resistive element 44, 45. The resistive element 44, 45 functions as a bias resistor that applies a bias voltage to the variable capacitive element 41, 42.

Capacitances of the variable capacitive elements 41 and 42 are controlled by a compensation voltage Vbias at an output terminal X that is supplied through the resistive elements 44, 45. A resistance value of the resistive element 44, 45 is set at a value that is sufficiently higher than an impedance of the variable capacitive element 41, 42, for example, several KΩ.

The impedance viewed from the connection point 46, 47 is high because of high resistance of the resistive element 44, 45, and hence, it is possible to avoid an influence of a circuit characteristic of the compensation voltage generation circuit 5 on a side of a circuit that is connected to the control input terminal 48. A configuration of the resistive element 44, 45 will be described later.

For example, a varactor with a capacitance that is changed by a voltage to be applied thereto is used for the variable capacitive element 41, 42. A voltage difference (Vtune−Vbias) between a control voltage Vtune and a compensation voltage Vbias is generated and such a voltage difference is adjusted, so that it is possible to adjust a capacitance of the variable capacitive element 41, 42. It is possible to provide a control in such a manner that a voltage difference (Vtune−Vbias) is increased to widen a depletion layer of a varactor and decrease a capacitance of the variable capacitive element 41, 42, or on the contrary, a voltage difference (Vtune−Vbias) is decreased to narrow a depletion layer of a varactor and increase such a capacitance.

An electric current Ic decreases with a temperature rise. Therefore, a compensation voltage Vbias that is generated by an electric current Ic and the resistor 30 also decreases with a temperature rise. Accordingly, in a case where a control voltage Vtune is constant, a voltage difference (Vtune−Vbias) increases with a temperature rise. That is, a voltage difference (Vtune−Vbias) that increases with a temperature rise is applied between electrodes of the variable capacitive element 41, 42. Thereby, a capacitance of the variable capacitive element 41, 42 decreases with a temperature rise.

A drain of an NMOS transistor 32 is connected to a point P where one end of the inductive element 61 is connected thereto. A source of the NMOS transistor 32 is connected to the electric power source supply line 11. A drain of an NMOS transistor 33 is connected to a point Q where the other end of the inductive element 61 is connected thereto. A source of the NMOS transistor 33 is connected to the electric power source supply line 11. A gate of the NMOS transistor 32 is connected to a drain of the NMOS transistor 33 and a gate of the NMOS transistor 33 is connected to a drain of the NMOS transistor 32. That is, the NMOS transistors 32 and 33 compose a cross-couple connection.

The cross-couple-connected NMOS transistors 32 and 33 operate as negative resistances. The cross-couple-connected NMOS transistors 32 and 33 compensate for a loss in the LC resonance circuit 7, and the voltage-controlled oscillator 4 oscillates at a frequency that is defined by a resonance frequency of the LC resonance circuit 7. A positive phase output VOP and a negative phase output VON are output from terminals 52, 53 where drains of the NMOS transistors 32, 33 are connected thereto, respectively.

An oscillation frequency of the voltage-controlled oscillator 4 is generally represented by $1/(2\pi\sqrt{(L \times C)})$. Herein, L is an inductance of the inductive element 61, and C is defined by a capacitance of a series circuit of the capacitive element 40, the variable capacitive elements 41, 42, and the capacitive element 43 and a parasitic capacitance of each of the NMOS transistors 32 and 33 and the inductive element 61.

Parasitic capacitances (non-illustrated) of drains of the NMOS transistors 32 and 33 increase with a temperature rise. Parasitic capacitances of drains of the NMOS transistors 32 and 33 are included in a capacitance C of the LC resonance circuit 7, and hence, in a case of a configuration with no temperature compensation, an oscillation frequency of the voltage-controlled oscillator 4 generally decreases with a temperature rise.

In the voltage-controlled oscillator 4 according to the present embodiment, a compensation voltage Vbias that changes with a temperature thereof is supplied to electrodes of the variable capacitive elements 41, 42 through the resistive elements 44, 45, respectively. Thereby, it is possible to reduce a variation of an oscillation frequency that is caused by a temperature change. For example, it is possible to reduce decreasing of an oscillation frequency that is caused by increasing parasitic capacitances (non-illustrated) of drains of the cross-couple-connected NMOS transistors 32, 33 with a temperature rise.

A voltage difference (Vtune−Vbias) between a control voltage Vtune and a compensation voltage Vbias is applied between both electrodes of the variable capacitive element 41, 42 to control capacitances, per se, of the variable capacitive elements 41, 42 that compose the LC resonance circuit 7, so that a temperature dependence is reduced. Accordingly, it is not necessary to use another capacitive element for temperature compensation. It is possible to avoid degradation of a noise characteristic of a voltage-controlled oscillator, an increase of a surface area of an integrated circuit device that composes the voltage-controlled oscillator, and a cost increase that are involved with addition of a capacitive element for temperature compensation.

Furthermore, an output terminal X of the compensation voltage generation circuit 5 is directly connected to the variable capacitive element 41, 42 by the resistive element 44, 45. By a simple configuration where the resistive element 44, 45 that functions as a bias resistor for the variable capacitive element 41, 42 is highly resistive, it is possible to avoid influencing of a circuit characteristic of the compensation voltage generation circuit 5 on a side of a circuit that generates a control voltage Vtune. For example, an influence on the loop filter 3 that supplies a control voltage Vtune is avoided. Accordingly, it is possible to design a PLL circuit that includes the loop filter 3 without taking a circuit characteristic of the compensation voltage generation circuit 5 into consideration. As a result, it is possible to stabilize a circuit operation of a PLL circuit that incorporates the voltage-controlled oscillator 4 therein. Furthermore, it is possible for the resistive element 44, 45 to avoid influencing of a circuit characteristic of the compensation voltage generation circuit 5 on a side of a circuit that generates a control voltage Vtune, and hence, it is also possible to insert, for example, a filter (non-illustrated) for reducing noise of the compensation voltage generation circuit 5 between the compensation voltage generation circuit 5 and the resistive element 44, 45. Furthermore, the resistive element 44, 45 that functions as a bias resistor is connected to an output terminal X of the compensation voltage generation circuit 5, and thereby, a bias resistor does not have to be provided on a side of the control input terminal 48. Accordingly, it is possible to eliminate a circuit element between the loop filter 3 and the control input terminal 48, and hence, design of the loop filter 3 is facilitated.

Figure 3A:
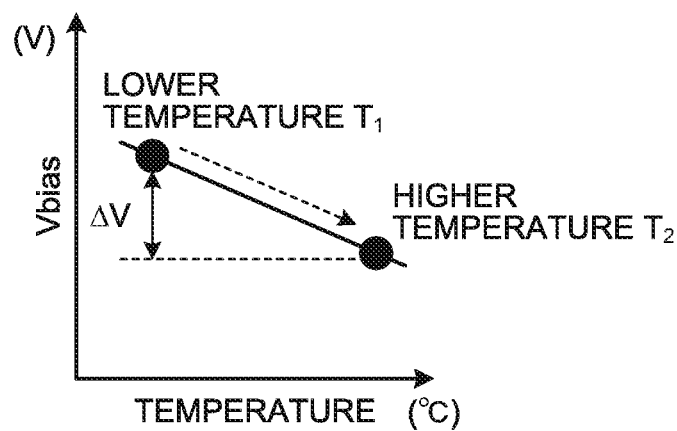
FIG. 3A and FIG. 3B are diagrams for illustrating a relationship between a temperature change and a capacitance change of a voltage-controlled oscillator according to an embodiment of FIG. 2.
Figure 3B:
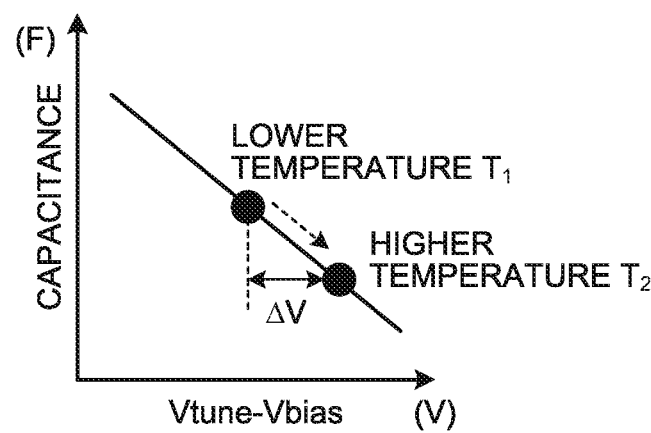

FIG. 3A and FIG. 3B are diagrams for illustrating a relationship between a temperature change and a capacitance change of the voltage-controlled oscillator 4 according to the embodiment of FIG. 2. FIG. 3A illustrates a relationship between a temperature and a compensation voltage Vbias that is output by the compensation voltage generation circuit 5. An electric current Ic of the negative temperature characteristic electric current source 20 of the compensation voltage generation circuit 5 of the voltage-controlled oscillator 4 according to the embodiment of FIG. 2 decreases with a rise from a lower temperature $T_1$ to a higher temperature $T_2$. Therefore, a compensation voltage Vbias that is generated by such an electric current Ic and the resistor 30 decreases by ΔV. Thereby, in a case where a control voltage Vtune is constant, a voltage difference (Vtune−Vbias) between such a control voltage Vtune and a compensation voltage Vbias increases with a temperature rise.

FIG. 3B illustrates a relationship between a voltage difference (Vtune−Vbias) between a control voltage Vtune and a compensation voltage Vbias and a capacitance of the variable capacitive element 41, 42. In a case where a capacitance of the variable capacitive element 41, 42 of the voltage-controlled oscillator 4 according to the embodiment of FIG. 2 is composed of, for example, a depletion layer of a PN junction that is reversely biased, a voltage difference (Vtune−Vbias) increases by ΔV, and thereby, such a depletion layer widens to decrease a capacitance thereof. That is, a capacitance of the variable capacitive element 41, 42 decreases with rising of a temperature from $T_1$ to $T_2$. Decreasing of a capacitance of the variable capacitive element 41, 42 functions so as to increase an oscillation frequency of the voltage-controlled oscillator 4, and hence, it is possible to reduce a temperature dependence of the voltage-controlled oscillator 4 with an oscillation frequency that decreases with a temperature rise.

Figure 4:
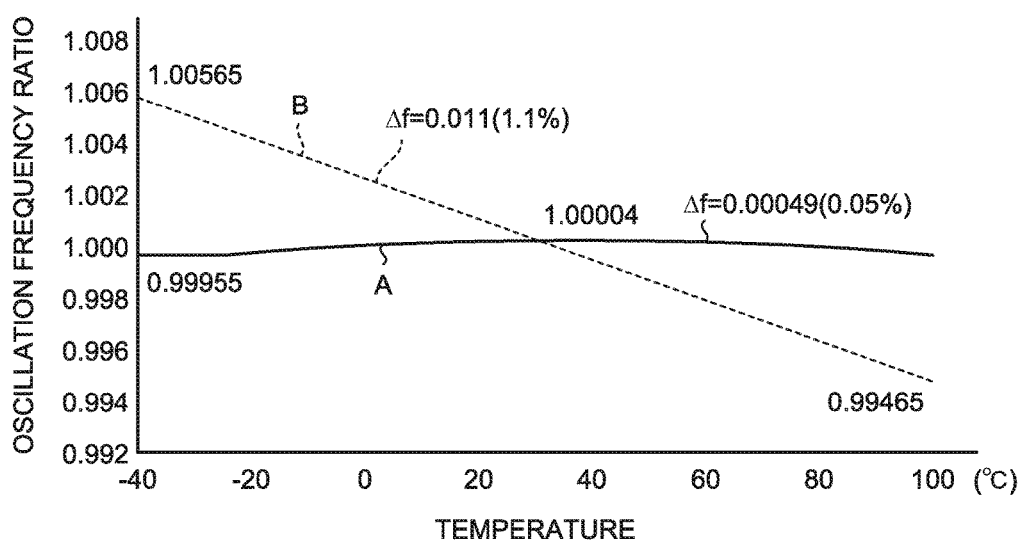
FIG. 4 is a diagram illustrating a simulation result of a voltage-controlled oscillator.

FIG. 4 illustrates a simulation result of a voltage-controlled oscillator. A horizontal axis indicates a temperature and a vertical axis indicates a normalized ratio of an oscillation frequency. Normalized one is provided while an oscillation frequency of A at 20° C. is a reference. In FIG. 4, A illustrates a change of an oscillation frequency of the voltage-controlled oscillator 4 according to the embodiment of FIG. 2. B is a result of a simulation for comparison that is executed for a configuration that does not include the compensation voltage generation circuit 5.

In a case where a temperature is changed from −40° C. to 100° C., for such a configuration B that does not include the compensation voltage generation circuit 5, an oscillation frequency varies from 1.00565 to 0.99465, so that a variation Δf is 0.011 and a rate of such a variation is 1.1%. On the other hand, in the present embodiment A, an oscillation frequency varies from 1.00004 to 0.99955, so that a variation Δf is 0.00049. That is, a rate of such a variation is reduced to be 0.05%. A capacitance of the variable capacitive element 41, 42 is controlled by a voltage difference (Vtune−Vbias) that increases with a temperature rise, and thereby, a variation of an oscillation frequency that is caused by a temperature change is greatly reduced.

Figure 5:
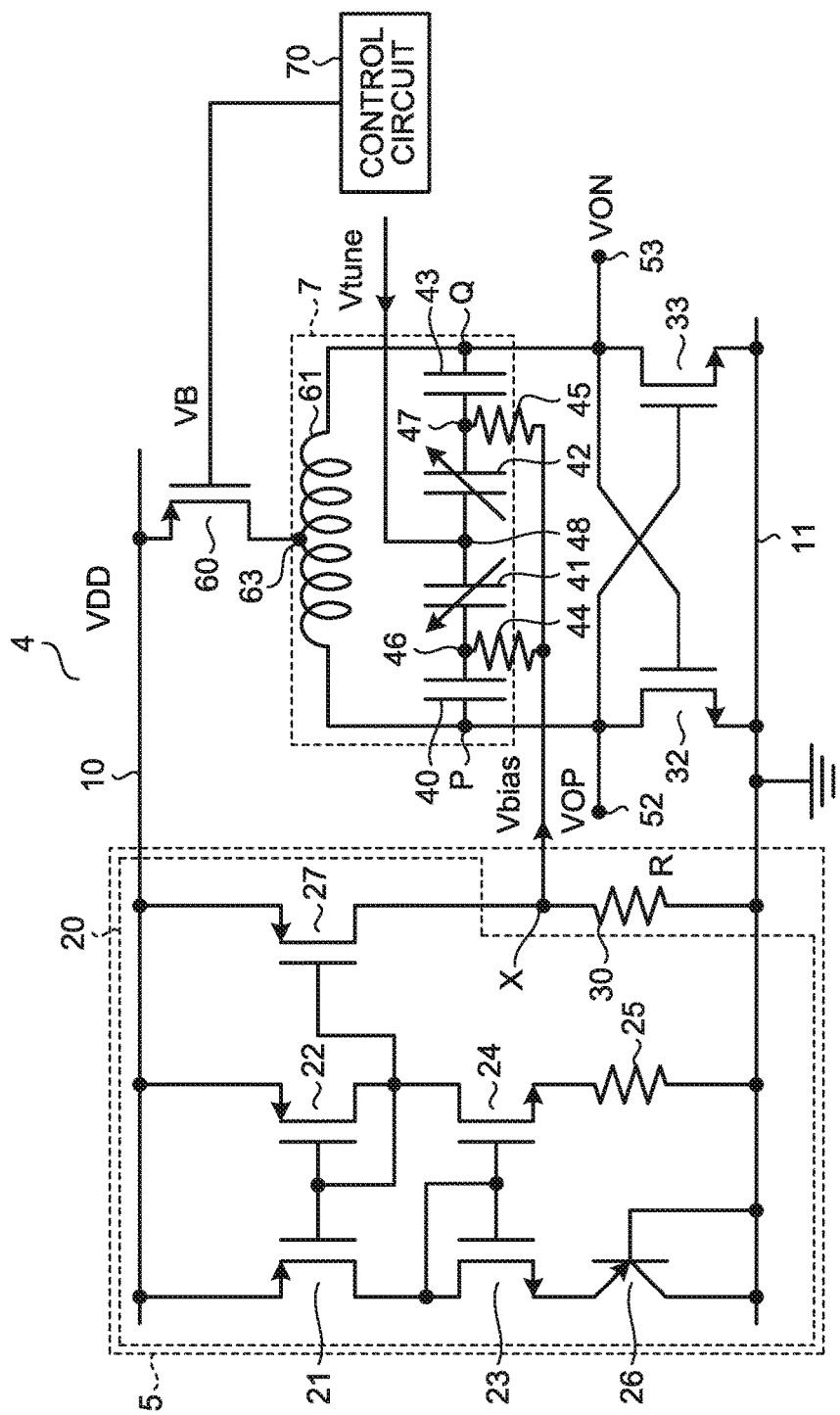
FIG. 5 is a diagram specifically illustrating a configuration of a voltage-controlled oscillator according to a first embodiment of FIG. 2.

FIG. 5 is a diagram specifically illustrating a configuration of a compensation voltage generation circuit 5 of a voltage-controlled oscillator 4 according to the embodiment of FIG. 2. A component that corresponds to that of the embodiment having already been described is provided with an identical symbol, and a redundant description is provided only in a case where it is needed. The same applies to the following.

A gate of a PMOS transistor 60 of the voltage-controlled oscillator 4 is supplied with a bias voltage VB from a control circuit 70.

The compensation voltage generation circuit 5 has a negative temperature characteristic electric current source 20. The negative temperature characteristic electric current source 20 has PMOS transistors 21, 22 with sources connected to an electric power source supply line 10. Gates of the PMOS transistors 21, 22 are commonly connected thereto.

A drain of the PMOS transistor 21 is connected to a gate and a drain of an NMOS transistor 23. A source of the NMOS transistor 23 is connected to an emitter of a PNP transistor 26. A collector and a base of the PNP transistor 26 are connected to an electric power source supply line 11. The PNP transistor composes a diode connection A gate and a drain of the PMOS transistor 22 are connected to a drain of an NMOS transistor 24. A source of the NMOS transistor 24 is connected to one end of a resistor 25. The other end of the resistor 25 is connected to the electric power source supply line 11. Gates of the NMOS transistors 23 and 24 are commonly connected thereto.

A source of a PMOS transistor 27 is connected to the electric power source supply line 10 and a gate thereof is connected to gates of the PMOS transistors 21 and 22 and a drain of the PMOS transistor 22. The PMOS transistors 21, 22, and 27 compose a current mirror circuit.

A drain of the PMOS transistor 27 is connected to a resistor 30 at an output terminal X. A compensation voltage Vbias generates at an output terminal X.

As dimensions of the NMOS transistors 23 and 24 are identical, a base-emitter voltage Vbe of the PNP transistor 26 of a diode connection is applied to both ends of the resistor 25. Accordingly, an electric current that is represented by Vbe/$R_{25}$ flows through the resistor 25.

A base-emitter voltage Vbe has a negative temperature coefficient that decreases with a temperature rise and generally has a temperature coefficient of −2 mV/° C. Therefore, an electric current that flows through the resistor 25 has a negative temperature coefficient. An electric current that flows through the resistor 25 flows through the NMOS transistor 24 and the PMOS transistor 22.

The PMOS transistors 22 and 27 compose a current mirror circuit, and hence, in a case where dimensions of both of them are identical, a drain electric current of the PMOS transistor 27 is identical to a drain electric current of the PMOS transistor 22. That is, an electric current with a value that is identical to a drain electric current of the PMOS transistor 22 is supplied to the resistor 30. Therefore, an electric current that is supplied from the PMOS transistor 27 to the resistor 30 decreases with a temperature, and hence, a compensation voltage Vbias that decreases with a temperature generates at an output terminal X.

Second Embodiment

Figure 6:
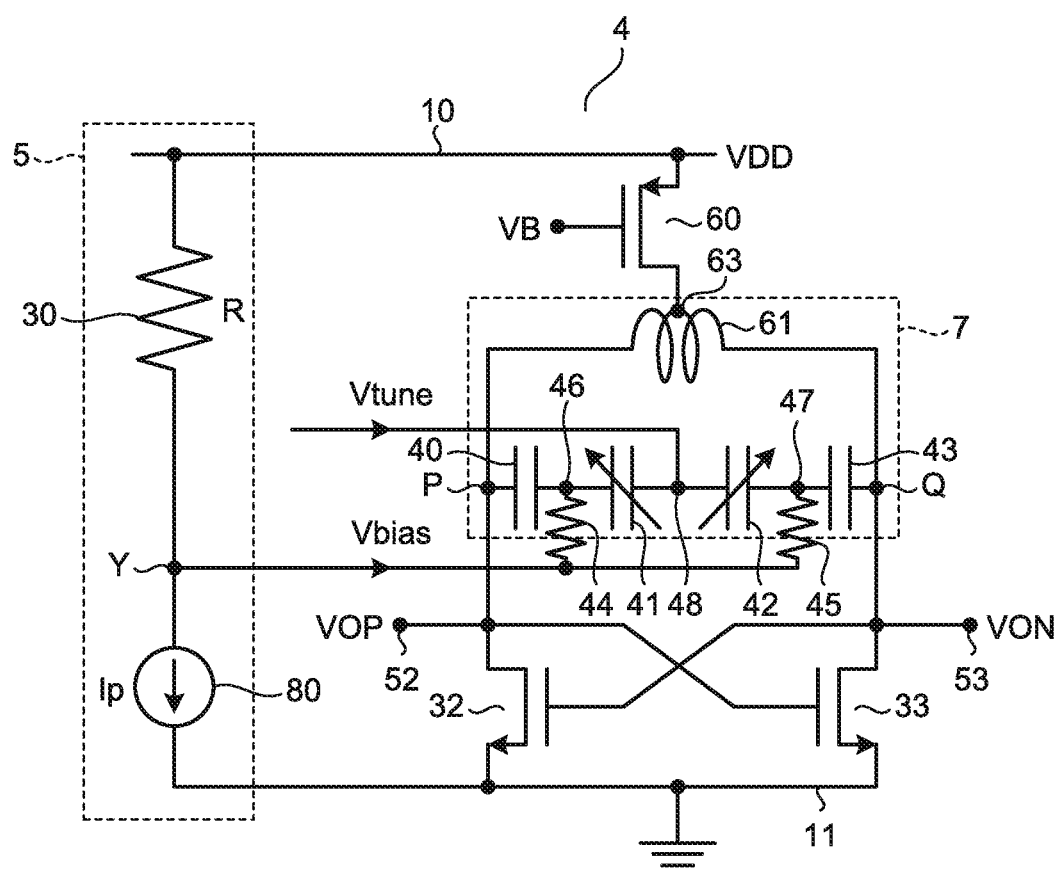
FIG. 6 is a diagram illustrating a configuration of a voltage-controlled oscillator according to a second embodiment.

FIG. 6 is a diagram illustrating a configuration of a voltage-controlled oscillator 4 according to a second embodiment. A compensation voltage generation circuit 5 of the voltage-controlled oscillator 4 according to the present embodiment has a positive temperature characteristic electric current source 80 that outputs an electric current Ip with an electric current value that increases with a temperature rise.

It is possible to compose the positive temperature characteristic electric current source 80 with a Proportional-to-Absolute-Temperature (PTAT) electric current source that has a characteristic with a positive slope and in proportion to an absolute temperature.

A resistor 30 is supplied with an electric current Ip of the positive temperature characteristic electric current source 80. An electric current Ip increases with a temperature rise, and hence, a voltage drop at the resistor 30 increases with a temperature. A compensation voltage Vbias at an output terminal Y is a voltage provided by subtracting a voltage drop at the resistor 30 from an electric power source voltage VDD. Therefore, in a case where an electric power source voltage VDD is constant, a compensation voltage Vbias at an output terminal Y decreases with a temperature rise. As a result, a voltage difference (Vtune−Vbias) from a control voltage Vtune that is applied to both electrodes of variable capacitive element 41, 42 increases with a temperature rise. Accordingly, a capacitance of the variable capacitive element 41, 42 decreases with a temperature rise, and functions so as to increase an oscillation frequency. Thereby, it is possible to reduce a temperature dependence of the voltage-controlled oscillator 4 with an oscillation frequency that decreases with a temperature rise.

The compensation voltage generation circuit 5 of the voltage-controlled oscillator 4 according to the present embodiment generates a compensation voltage Vbias that decreases with a temperature rise, by the positive temperature characteristic electric current source 80 that supplies an electric current Ip that increases with a temperature rise and the resistor 30. A voltage difference (Vtune−Vbias) from a control voltage Vtune is applied to both electrodes of the variable capacitive element 41, 42, and thereby, it is possible to reduce a temperature dependence of the voltage-controlled oscillator 4. Furthermore, an output terminal Y of the compensation voltage generation circuit 5 is connected to the LC resonance circuit 7 through resistive element 44, 45 as high resistances, and thereby, it is possible to avoid an influence of a circuit characteristic of the compensation voltage generation circuit 5 on a side of a circuit that is connected to a control input terminal 48.

Figure 7:
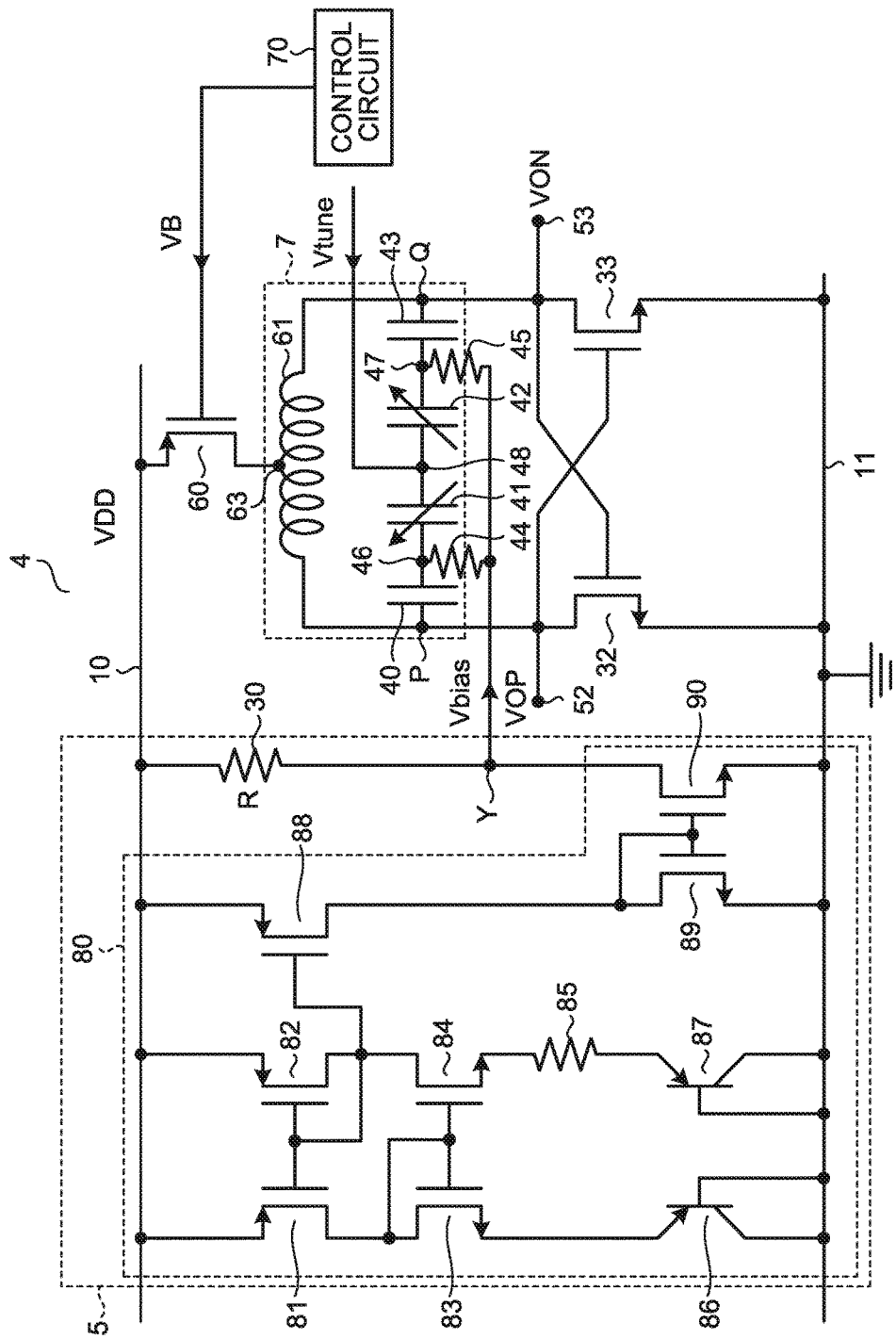
FIG. 7 is a diagram specifically illustrating a configuration of a voltage-controlled oscillator according to second embodiment of FIG. 6.

FIG. 7 is a diagram specifically illustrating a configuration of a compensation voltage generation circuit 5 of a voltage-controlled oscillator 4 according to the second embodiment of FIG. 6.

The compensation voltage generation circuit 5 according to the present embodiment has a positive temperature characteristic electric current source 80. The positive temperature characteristic electric current source 80 has PMOS transistors 81, 82 with sources that are connected to an electric power source supply line 10. Gates of the PMOS transistors 81 and 82 are commonly connected thereto.

A drain of the PMOS transistor 81 is connected to a gate and a drain of the NMOS transistor 83. A source of the NMOS transistor 83 is connected to an emitter of a PNP transistor 86. A collector and a base of the PNP transistor 86 are connected to an electric power source supply line 11. The PNP transistor 86 composes a diode connection.

A gate and a drain of the PMOS transistor 82 are connected to a drain of an NMOS transistor 84. A source of the NMOS transistor 84 is connected to one end of a resistor 85. The other end of the resistor 85 is connected to an emitter of a PNP transistor 87. A collector and a base of the PNP transistor 87 are connected to the electric power source supply line 11. The PNP transistor 87 composes a diode connection.

Gates of the NMOS transistors 83 and 84 are commonly connected thereto and also connected to a drain of the NMOS transistor 83.

A source of a PMOS transistor 88 is connected to the electric power source supply line 10 and a gate thereof is connected to gates of the PMOS transistors 81 and 82 and a drain of the PMOS transistor 82. The PMOS transistors 81, 82, and 88 compose a current mirror circuit.

A drain of the PMOS transistor 88 is connected to a drain of an NMOS transistor 89. A gate and a drain of the NMOS transistor 89 are connected thereto and a source thereof is connected to the electric power source supply line 11. A gate of the NMOS transistor 89 is connected to a gate of an NMOS transistor 90. A source of the NMOS transistor 90 is connected to the electric power source supply line 11. The NMOS transistors 89 and 90 compose a current mirror circuit.

A drain of the NMOS transistor 90 is connected to one end of a resistor 30 at an output terminal Y. The other end of the resistor 30 is connected to the electric power source supply line 10. A compensation voltage Vbias generates at an output terminal Y.

For example, as a ratio of emitter surface areas of the PNP transistors 86 and 87 is 1:n, a difference ΔVbe (=(kT/q)ln(n)) from such a base-emitter voltage Vbe thereof is applied to both ends of the resistor 85. Herein, k, T, and q represent a Boltzmann constant, an absolute temperature, and an electric charge of an electron, respectively. That is, a voltage Vbe that is proportional to an absolute temperature T is applied to both ends of the resistor 85. Accordingly, as $R_{85}$ is a resistance value of the resistor 85, an electric current that flows through the resistor 85 is represented by $\Delta Vbe/R_{85}$, namely, $(kT/qR_{85})\ln(n)$.

As an electric current that flows through the resistor 85 flows through the PMOS transistor 82 and the PMOS transistor 88 that composes a current mirror circuit has an identical dimension, an electric current with an identical value also flows through the PMOS transistor 88. An electric current that flows through the PMOS transistor 88 flows through the NMOS transistor 89, and further, as the NMOS transistor 90 that composes a current mirror circuit together with the NMOS transistor 89 has an identical dimension, an electric current with an identical value also flows through the NMOS transistor 90. As a result, an electric current that increases in proportion to an absolute temperature T is supplied to the resistor 30.

A compensation voltage Vbias at an output terminal Y is a voltage provided by subtracting a voltage drop at the resistor 30 from an electric power source voltage VDD of the electric power source supply line 10. An electric current that flows through the resistor 30 increases in proportion to an absolute temperature T, and hence, a voltage drop at the resistor 30 increases in proportion to a temperature thereof. Thereby, a compensation voltage Vbias that decreases with a temperature rise generates at an output terminal Y.

Figure 8:
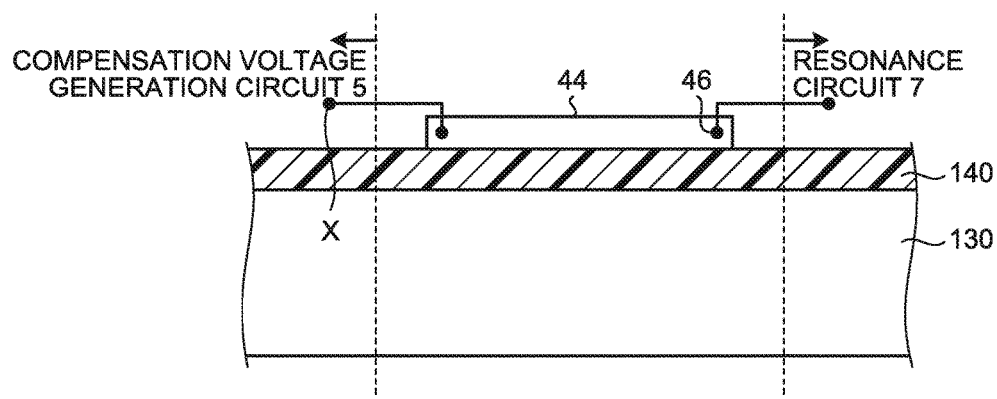
FIG. 8 is a diagram schematically illustrating a configuration example of a resistive element.

FIG. 8 is a diagram illustrating a configuration example of a resistive element 44, 45 that is provided between an output terminal X of a compensation voltage generation circuit 5 and an LC resonance circuit 7. The resistive element 44 is illustrated as an example. The resistive element 44 is formed on an insulation oxide layer 140 formed on a surface of a semiconductor substrate 130. For example, it is formed of a polycrystalline silicon layer. In a case where a gate of each MOS transistor that composes the compensation voltage generation circuit 5 is formed of a polycrystalline silicon, it is possible to form the resistive element 44 simultaneously in a process for forming a gate of such a MOS transistor.

One end 46 of the resistive element 44 is connected to electrodes of the capacitive element 40 and the variable capacitive element 41 of the LC resonance circuit 7 through, for example, a via (non-illustrated) and a metal wire (non-illustrated) formed on an upper layer of one end 46 of the resistive element 44, and the other end is connected to an output terminal X of the compensation voltage generation circuit 5 through a via (non-illustrated) and a metal wire (non-illustrated) formed on an upper layer of the other end of the resistive element 44.

The resistive element 44 is formed on an oxide insulation layer 140 formed on a surface of the semiconductor substrate 130, so that a material of the resistive element 44 is not limited to a semiconductor material and it is possible to execute appropriate selection thereof depending on a desired resistance value.

Figure 9:
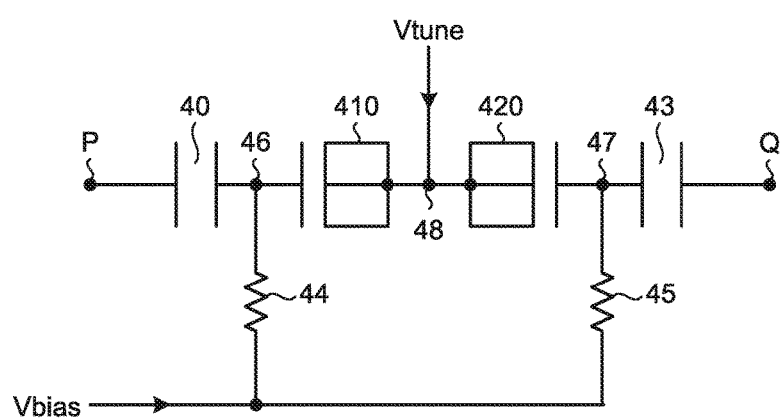
FIG. 9 is a diagram illustrating a configuration example of a variable capacitive element.

FIG. 9 is a diagram illustrating a configuration example of a variable capacitive element. For a variable capacitive element, it is possible to use PMOS capacitors 410, 420. The PMOS capacitor 410 corresponds to the variable capacitive element 41 having already been described, and the PMOS capacitor 420 corresponds to the variable capacitive element 42. A P-type source (non-illustrated) and drain (non-illustrated) are formed on an N-type well (non-illustrated) of a semiconductor substrate, and the source and the drain are commonly connected to the well, so that it is possible to form the PMOS capacitor 410, 420. A depletion layer is adjusted by a voltage difference (Vtune−Vbias) that is applied between a gate and a source or a drain, so that it is possible to compose a variable capacitive element with a variable capacitance.

An accumulation-mode MOS capacitor may be used for a variable capacitive element. It is possible to provide a configuration where an N-type source and drain are formed on an N-type well (non-illustrated) of a semiconductor substrate and commonly connected thereto, so that a capacitance is provided between a gate and them. A depletion layer is adjusted by a voltage difference (Vtune–vbias) that is applied between a gate and a commonly connected source and drain to form a variable capacitive element with a variable capacitance. An accumulation-mode MOS capacitor has a feature that a capacitance thereof is monotonically changed in both a reverse bias state and a forward bias state. Accordingly, it is possible to provide a circuit configuration that has flexibility in a setting range of a voltage difference (Vtune–Vbias).

Figure 10:
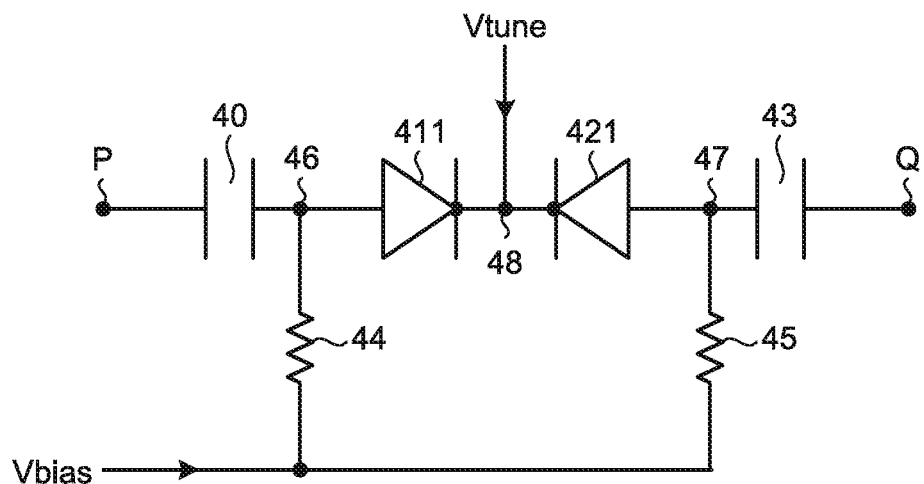
FIG. 10 is a diagram illustrating another configuration example of a variable capacitive element.

FIG. 10 is a diagram illustrating another configuration of a variable capacitive element. Diode elements 411, 421 compose variable capacitive elements. The diode element 411 corresponds to the variable capacitive element 41 having already been described and the diode element 421 corresponds to the variable capacitive element 42. A PN junction of the diode element 411, 421 is reversely biased by a voltage difference (Vtune–Vbais) that is applied between a cathode and an anode of the diode element 411, 421. A width of a depletion layer of the diode element 411, 421 is adjusted by a voltage difference (Vtune–Vbias) to form a variable capacitive element with a variable capacitance.

Figure 11:
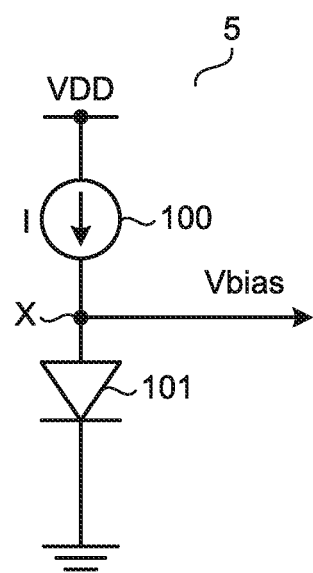
FIG. 11 is a diagram illustrating one configuration example of a compensation voltage generation circuit.

FIG. 11 is a diagram illustrating another configuration example of the compensation voltage generation circuit 5.

The compensation voltage generation circuit 5 has a constant electric current source 100 and a diode 101. A forward direction voltage Vf of the diode 101 has a negative temperature characteristic that decreases with a temperature rise. In general, a forward direction voltage Vf has a temperature characteristic of approximately −1.5 mV/° C. to −2 mV/° C. Therefore, a constant electric current I is supplied to the diode 101 and a forward direction voltage Vf is supplied as a compensation voltage Vbias, and thereby, it is possible to supply a bias voltage Vbias that decreases with a temperature rise from an output terminal X.

It is possible to compose the constant electric current source 100 by using, for example, a bandgap reference voltage generation circuit (non-illustrated). It is possible to provide a configuration where a predetermined resistance is biased by an output voltage Vout of a bandgap reference voltage generation circuit and an electric current that flows through such a resistor is supplied as a constant electric current. A bandgap reference voltage generation circuit adds a voltage that has a positive temperature characteristic to a base-emitter voltage Vbe of a bipolar transistor that has a negative temperature characteristic, and thereby, outputs an output voltage Vout that is stable with respect to a temperature thereof.

Furthermore, the constant electric current source 100 may be configured as a constant electric current source that does not depend on a temperature thereof, by, for example, adding electric currents of a PTAT electric current source and a CTAT electric current source in an appropriate proportion. Alternatively, an electric current source that has a slope with respect to a temperature may be configured by adding electric currents of a PTAT electric current source and a CTAT electric current source in an appropriate proportion in order to further change a slope from a temperature characteristic of a diode.

Figure 12:
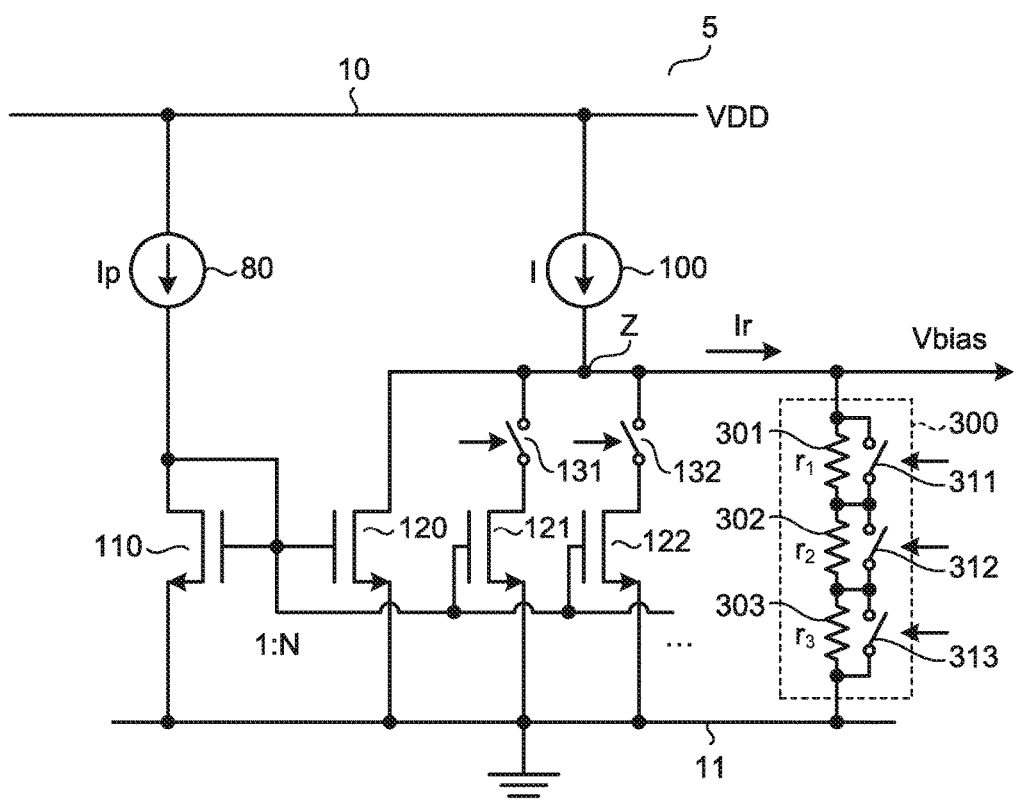
FIG. 12 is a diagram illustrating another configuration example of a compensation voltage generation circuit.

FIG. 12 is a diagram illustrating another configuration example of a compensation voltage generation circuit 5. It has an NMOS transistor 110 with a drain and a gate that are connected to a positive temperature characteristic electric current source 80. A source of the NMOS transistor 110 is connected to an electric power source supply line 11. It has an NMOS transistor 120 with a source that is connected to the electric power source supply line 11. Gates of the NMOS transistors 110 and 120 are commonly connected thereto. NMOS transistors 121, 122 are connected in parallel to the NMOS transistor 120.

Gates of the NMOS transistors 121, 122 are commonly connected to gates of the NMOS transistors 110 and 120. That is, the NMOS transistor 110 and the NMOS transistors 120 to 122 compose a current mirror circuit. Dimensions of the NMOS transistor 110 and the NMOS transistors 120 to 122 are identical thereto and the number of the NMOS transistors 120 to 122 is adjusted, so as to provide a configuration where an electric current that is N times as much as an electric current Ip that is supplied to a drain of the NMOS transistor 110 is subtracted from an electric current I of a constant electric current source 100. An electric current Ir provided by subtracting electric currents that flows through the transistors 120 to 122 from an electric current I is supplied to a variable resistor 300.

That is, an electric current Ir that is supplied to the variable resistor 300 is represented by formula (1):

$$Ir = I - N \times Ip \qquad (1).$$

As $R_{300}$ is a resistance value of the variable resistor 300, a compensation voltage Vbias at an output terminal Z is represented by formula (2):

$$Vbias = R_{300} \times Ir = R_{300} \times (I - N \times Ip) \qquad (2).$$

In formula (2), an electric current Ip has a positive temperature characteristic. Therefore, it is possible to generate a compensation voltage Vbias that decreases with a temperature rise at an output terminal Z.

The number N of the NMOS transistors 120 to 122 that are connected in parallel and a value $R_{300}$ of the resistor 300 are adjusted, so that it is possible to adjust an offset voltage and a slope of a compensation voltage Vbias appropriately.

The number of the NMOS transistors that are connected in parallel is provided by controlling on/off of switches 131, 132 that are connected to a drain of each NMOS transistor. A control signal is supplied from, for example, the control circuit 70. Additionally, a value of an electric current to be subtracted from an electric current I may be adjusted by changing dimensions of the NMOS transistors 120 to 122 that are connected in parallel.

On/off of switches 311 to 313 is controlled to adjust the number of resistors 301 to 303 that are connected serially, and thereby, it is possible for a resistance value $R_{300}$ of the variable resistor 300 to be variable. That is, the switches 311 to 313 that are connected in parallel to the resistors 301 to 303, respectively, are turned on, and thereby, corresponding resistance values r1 to r3 are short-circuited, so that a resistance value of the variable resistor 300 is changed. Control signals for the switches 311 to 313 are supplied from, for example, the control circuit 70.

Additionally, a positive temperature characteristic electric current source with a smaller slope with respect to a temperature than that of the positive temperature characteristic electric current source 80 or a negative temperature characteristic electric current source may be provided instead of a constant electric current source 100. A configuration is provided in such a manner that an electric current with a greater increase with a temperature rise is subtracted from an electric current with a less increase with a temperature rise than that of an electric current of the positive temperature characteristic electric current source 80 or from an electric current that decreases with a temperature rise, and hence, a configuration is provided to generate a compensation voltage Vbias that decreases with a temperature rise similarly to formula (2).

It is also possible for the compensation voltage generation circuit 5 to have a configuration where a constant electric current is supplied to a resistor (non-illustrated) that has a negative temperature coefficient and a voltage drop at such a resistor is output as a compensation voltage Vbias. A voltage drop at a resistor that has a negative temperature characteristic decreases with a temperature rise, and hence, a configuration is provided to generate a compensation voltage Vbias that decreases with a temperature rise.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voltage-controlled oscillator with an oscillation frequency that is defined by values of a capacitance of a capacitive element and an inductance of an inductive element, wherein the capacitive element includes a variable capacitive element with a capacitance that is changed by a voltage to be applied thereto, comprising:
    a control input terminal that is connected to one electrode of the variable capacitive element, and supplied with a control voltage that controls the oscillation frequency;
    a compensation voltage generation circuit that generates a voltage that changes with a temperature thereof; and
    a resistive element with one end that is directly connected to another electrode of the variable capacitive element and another end that is supplied with a voltage at an output terminal of the compensation voltage generation circuit,
    wherein the compensation voltage generation circuit includes:
        a first electric current source that supplies an electric current that increases with a temperature rise;
        a second electric current source that has a temperature characteristic different from that of the first electric current source; and
        a variable resistor that is supplied with an electric current provided by subtracting an electric current that is predetermined constant times as much as the electric current of the first electric current source from an electric current of the second electric current source.

2. The voltage-controlled oscillator according to claim 1, wherein:
    the variable capacitive element includes a first variable capacitive element and a second variable capacitive element, one electrode of each thereof is connected to the control input terminal; and
    the resistive element includes a first resistive element and a second resistive element, one end of each thereof is directly connected to another electrode of the first capacitive element or the second capacitive element that corresponds thereto, and another end of each thereof is supplied with the voltage at the output terminal of the compensation voltage generation circuit.

3. The voltage-controlled oscillator according to claim 1, wherein the compensation voltage generation circuit generates a voltage that decreases a capacitance of the variable capacitive element with a temperature rise.

4. The voltage-controlled oscillator according to claim 1, wherein a temperature characteristic of the second electric current source is a characteristic to cause a constant electric current to flow against a temperature change.

5. The voltage-controlled oscillator according to claim 1, wherein:
    the variable capacitive element is composed of a variable capacitive diode; and
    a reverse bias is applied to the variable capacitive element by the control voltage and the voltage of the compensation voltage generation circuit.

6. The voltage-controlled oscillator according to claim 1, wherein the resistive element is formed on an insulation layer formed on a surface of a semiconductor substrate.

7. A voltage-controlled oscillator, comprising:
    a control input terminal where a control voltage that controls an oscillation frequency of the voltage-controlled oscillator is applied thereto;
    a first output terminal that outputs a positive phase signal with the oscillation frequency;
    a second output terminal that outputs a negative phase signal with the oscillation frequency;
    a first common connection terminal;
    a second common connection terminal;
    a first capacitive element connected between the first output terminal and the first common connection terminal;
    a first variable capacitive element connected between the first common connection terminal and the control input terminal;
    a second capacitive element connected between the second output terminal and the second common connection terminal;
    a second variable capacitive element connected between the second common connection terminal and the control input terminal;
    an inductive element connected between the first output terminal and the second output terminal;
    a first resistive element with one end directly connected to the first common connection terminal;
    a second resistive element with one end directly connected to the second common connection terminal;
    a compensation voltage generation circuit that supplies a voltage that changes with a temperature thereof to another end of each of the first resistive element and the second resistive element;
    a first MOS transistor with a drain connected to the first output terminal, a gate connected to the second output terminal, and a source connected to ground; and
    a second MOS transistor with a drain connected to the second output terminal, a gate connected to the first output terminal, and a source connected to ground,
    wherein the compensation voltage generation circuit includes:
        a first electric current source that supplies an electric current that increases with a temperature rise;
        a second electric current source that has a temperature characteristic different from that of the first electric current source; and
        a variable resistor that is supplied with an electric current provided by subtracting an electric current that is predetermined constant times as much as the electric current of the first electric current source from an electric current of the second electric current source.

8. The voltage-controlled oscillator according to claim 7, wherein the first resistive element and the second resistive element are formed on an insulation layer formed on a surface of a semiconductor substrate.

9. A phase locked loop circuit, comprising:
a frequency divider that divides a frequency of an output signal of a voltage-controlled oscillator,
a phase-frequency detector that outputs a signal dependent on a phase difference between an output signal of the frequency divider and a reference input signal; and
a loop filter that outputs a control signal that controls the frequency of the output signal of the voltage-controlled oscillator depending on the signal of the phase-frequency detector,
wherein the voltage-controlled oscillator is a voltage-controlled oscillator with an oscillation frequency that is defined by values of a capacitance of a capacitive element and an inductance of an inductive element and has a following configuration:
a control input terminal that is supplied with the control signal from the loop filter;
a variable capacitive element with one electrode that is connected to the control input terminal;
a compensation voltage generation circuit that generates a voltage that changes with a temperature thereof; and
a resistive element with one end that is directly connected to another electrode of the variable capacitive element and another end that is supplied with a voltage at an output terminal of the compensation voltage generation circuit,
wherein the compensation voltage generation circuit includes:
a first electric current source that supplies an electric current that increases with a temperature rise;
a second electric current source that has a temperature characteristic different from that of the first electric current source; and
a variable resistor that is supplied with an electric current provided by subtracting an electric current that is predetermined constant times as much as the electric current of the first electric current source from an electric current of the second electric current source.

10. The phase locked loop circuit according to claim 9, wherein the resistive element is formed on an insulation layer formed on a surface of a semiconductor substrate.

11. A voltage-controlled oscillator with an oscillation frequency that is defined by values of a capacitance of a capacitive element and an inductance of an inductive element, wherein the capacitive element includes a variable capacitive element with a first electrode and a second electrode and a capacitance that is decreased by an increase of a voltage difference applied between the first electrode and the second electrode thereto, the voltage-controlled oscillator comprising:
a control input terminal that is connected to the first electrode of the variable capacitive element, and supplied with a control voltage that controls the oscillation frequency;
a compensation voltage generation circuit that generates a voltage which decreases with a temperature rise to decrease the capacitance of the variable capacitive element with a temperature rise at an output terminal, the compensation voltage generation circuit including:
a current source which provides a current in proportion to an absolute temperature; and
a resistor supplied with the current having a connection end, the connection end forming the output terminal, the current provided from the current source being supplied to the connection end; and
a resistive element with one end that is directly connected to the second electrode of the variable capacitive element and another end that is directly connected to the output terminal of the compensation voltage generation circuit.

12. The voltage-controlled oscillator according to claim 11, wherein
the variable capacitive element includes a first variable capacitive element and a second variable capacitive element, the first electrode of each thereof is connected to the control input terminal, and
the resistive element includes a first resistive element and a second resistive element, one end of each thereof is directly connected to the second electrode of the first capacitive element or the second capacitive element that corresponds thereto, and another end of each thereof is directly connected to the output terminal of the compensation voltage generation circuit.

* * * * *